(12) United States Patent
Bai et al.

(10) Patent No.: US 11,860,219 B2
(45) Date of Patent: Jan. 2, 2024

(54) DEVICE AND SYSTEM FOR DETECTING TOUCH PANEL

(71) Applicant: Yungu (Gu'an) Technology Co., Ltd., Hebei (CN)

(72) Inventors: Guoxiao Bai, Kunshan (CN); Yongzhi Zhang, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 336 days.

(21) Appl. No.: 17/491,814

(22) Filed: Oct. 1, 2021

(65) Prior Publication Data

US 2022/0018894 A1  Jan. 20, 2022

Related U.S. Application Data

(63) Continuation of application No. PCT/CN2020/098627, filed on Jun. 28, 2020.

(30) Foreign Application Priority Data

Sep. 29, 2019 (CN) .......................... 201910936856.2

(51) Int. Cl.
  *G01R 31/28* (2006.01)
  *G01R 31/52* (2020.01)
  (Continued)

(52) U.S. Cl.
  CPC ......... *G01R 31/2829* (2013.01); *G01R 31/52* (2020.01); *G06F 3/0416* (2013.01); *G06F 3/0446* (2019.05); *G06F 2203/04112* (2013.01)

(58) Field of Classification Search
  CPC .... G01R 31/2829; G01R 31/52; G01R 31/00; G06F 3/0416; G06F 3/0446; G06F 2203/04112
  See application file for complete search history.

(56) References Cited

U.S. PATENT DOCUMENTS 9,772,733 B2 *  9/2017  Lee ..................... G06F 3/04166
2008/0297168 A1  12/2008  Parker
(Continued)

FOREIGN PATENT DOCUMENTS

CN  1514939 A  7/2004
CN  1790037 A  6/2006
(Continued)

OTHER PUBLICATIONS

International Search Report dated Sep. 29, 2020 in corresponding International application No. PCT/CN2020/098627; 6 pages.
(Continued)

*Primary Examiner* — Giovanni Astacio-Oquendo
*Assistant Examiner* — Zannatul Ferdous
(74) *Attorney, Agent, or Firm* — Maier & Maier, PLLC

(57) ABSTRACT

A device and system for detecting a touch panel are used for detecting a metal mesh on the touch panel, where row direction channels and column direction channels on the metal meshes each include a plurality of touch units which are connected with each other. In the device for detecting a touch panel, a signal transceiving component includes a signal generating unit and a signal receiving unit, which are configured to be arranged on the same side of the metal meshes in preset relative positions, and send and receive a signal through capacitive coupling with the metal mesh, respectively; a defect detecting unit is configured to detect each of a plurality of touch units in the metal meshes based on a detection signal received by the signal receiving unit.

19 Claims, 6 Drawing Sheets

(51) Int. Cl.
*G06F 3/044* (2006.01)
*G06F 3/041* (2006.01)

(56) References Cited

U.S. PATENT DOCUMENTS

| | | | |
|---|---|---|---|
| 2015/0380593 A1 | 12/2015 | Dahal et al. | |
| 2019/0095034 A1* | 3/2019 | Xu | G06F 3/044 |
| 2019/0163321 A1* | 5/2019 | Kondoh | G06F 3/0418 |

FOREIGN PATENT DOCUMENTS

| | | | |
|---|---|---|---|
| CN | 1831550 A | 9/2006 |
| CN | 101107535 A | 1/2008 |
| CN | 101107536 A | 1/2008 |
| CN | 2009048604 A | 3/2009 |
| CN | 101769886 A | 7/2010 |
| CN | 101776976 A | 7/2010 |
| CN | 101887098 A | 11/2010 |
| CN | 102193038 A | 9/2011 |
| CN | 2011129339 A1 | 10/2011 |
| CN | 20130031024 A | 3/2013 |
| CN | 103713205 A | 4/2014 |
| CN | 108226834 A | 6/2018 |
| CN | 109216220 A | 1/2019 |
| CN | 110672948 A | 1/2020 |
| JP | H10188596 A | 7/1998 |
| JP | 2007171257 A | 7/2007 |
| TW | 200537112 A | 11/2005 |

OTHER PUBLICATIONS

Examination Report dated Sep. 18, 2020 of corresponding Chinese application No. 201910936856.2; 6 pages.

Examination Report dated Nov. 17, 2020 of corresponding Chinese application No. 201910936856.2; 7 bages.

Notice of Allowance daed Mar. 5, 2021 of corresponding Chinese application No. 201910936856.2; 2 pages.

M.R. Kump et al., "The efficient simulation of coupled point defect and impurity diffusion", IEEE Transactions on Computer-Aided Design, vol. 7, No. 2, Published: Feb. 29, 1988.

Zhengyong Liu et al., "Study of a completely non-contact inspection technique for detects in liquid crystal glass substrates", Robotics and Applications, Issue Date: Mar. 31, 2018. URL:https://kns.cnki.net/kcms/detail/detail.aspx?dbcode=CJFD&dbname=CJFDLAST2018&filename=JIQI201803011&uniplatform=NZKPT&v=qQy25mmd2FHCrv8.

* cited by examiner

DEVICE AND SYSTEM FOR DETECTING TOUCH PANEL

CROSS-REFERENCE TO RELATED APPLICATIONS

This application is a continuation of International Application No. PCT/CN2020/098627, filed on Jun. 28, 2020, which claims priority to Chinese Patent Application No. 201910936856.2, filed on Sep. 29, 2019. Both of the above applications are hereby incorporated by reference in their entireties.

TECHNICAL FIELD

The present disclosure relates to a detecting technology and particularly, to a device and system for detecting a touch panel.

BACKGROUND

With the use of touch screens in all-in-one computers, large-size notebook computers and other devices, the size of a touch panel gradually increases and data volume that is required to be processed also gradually increases. Therefore, the touch panel needs to have a smaller impedance to meet the requirements of a large-size touch screen. A metal mesh sensor (abbreviated as MM Sensor) is a new type of touch sensor at present. Compared with traditional touch technology (using indium tin oxide as a touch material), metal meshes in the MM Sensor touch technology are composed of extremely thin crossed metal wires, usually have an impedance of less than 10Ω, and is a preferred technology for producing a large-size touch screen. In addition, the metal mesh sensor has characteristics of low power consumption, sensitive touch, long service life, flexible and bendable, waterproof and explosionproof, and non-pollution. These unique characteristics make the MM Sensor gradually become a new favorite in the touch field.

In a manufacturing process of a touch panel, it is usually necessary to detect an on-off situation of circuits in metal meshes. In related arts, a detection of the metal meshes in the touch panel is mainly a non-contact scan detection row-by-row. The on-off situation of a channel is determined by detecting the presence or absence of signal at both ends of each row.

However, a detection reliability of an existing detection device is not high enough.

SUMMARY

Embodiments of the present disclosure provide a device and system for detecting a touch panel, improving detection reliability.

A first aspect of the embodiments of the present disclosure provides a device for detecting a touch panel, for detecting a metal mesh on the touch panel, the device for detecting a touch panel includes: a signal transceiving component that is movably arranged relative to the metal mesh, and includes a signal generating unit and a signal receiving unit, where the signal generating unit and the signal receiving unit are configured to be arranged on the same side of the metal meshes in preset relative positions, and send and receive a signal through capacitive coupling with the metal mesh respectively; a defect detecting unit that is configured to detect whether each of a plurality of touch units in the metal mesh has a defect based on a detection signal received by the signal receiving unit, and determine a position of the defect.

A second aspect of the embodiments of the present disclosure provides a system for detecting a touch panel, including a movement device and the device for detecting a touch panel according to the first aspect of the present disclosure and various possible designs of the first aspect; wherein the movement device is configured to control the signal transceiving component to move along a center line of a row direction channel of the metal mesh and a center line of a column direction channel thereof, and sending positioning information indicating a detection position of the signal transceiving component to the defect detecting unit.

The device and system for detecting a touch panel provided by the embodiments of the present disclosure are used for detecting metal meshes on the touch panel, wherein the metal mesh includes a plurality of row direction channels and a plurality of column direction channels insulated and intersected with the row direction channels; the row direction channels and the column direction channels each comprise the plurality of touch units connected with each other. The device for detecting a touch panel includes: a signal transceiving component and a defect detecting unit; wherein the signal transceiving component includes a signal generating unit and a signal receiving unit; the signal generating unit and the signal receiving unit are configured to be arranged on the same side of the metal meshes in preset relative positions, and send and receive a signal through capacitive coupling with the metal mesh, respectively; the defect detecting unit is configured to detect each of the plurality of touch units in the metal mesh based on a detection signal received by the signal receiving unit, thereby achieving detection of a defect of the metal mesh of the touch panel, positioning the defect in the touch unit, and improving a detection reliability.

BRIEF DESCRIPTION OF THE DRAWINGS

FIG. 1b is a schematic diagram of a microstructure of the metal mesh shown in FIG. 1a;

DETAILED DESCRIPTION OF THE EMBODIMENTS

In order to make purposes, technical solutions and advantages of embodiments of the present disclosure more explicit, the technical solutions in the embodiments of the present disclosure will be described clearly and completely below in conjunction with the accompanying drawings in the embodiments of the present disclosure. Obviously, the described embodiments are some embodiments of the present disclosure, not all of them. Based on the embodiments of the present disclosure, all other embodiments obtained by those skilled in the art without creative works shall fall within the protection scope of the present disclosure.

The terms "first" and "second" are only used for a purpose of description, and cannot be considered as indicating or implying relative importance or implicitly indicating the number of indicated technical features. It should be understood that, in the present disclosure, "including" and "having" and any variations of them are intended to cover non-exclusive inclusion. Depending on the context, "if" as used herein can be interpreted as "in the case of" or "when" or "in response to determination" or "in response to detection".

The technical solutions of the present disclosure will be described in detail below with specific embodiments. The following specific embodiments can be combined with each other, and the same or similar concepts or processes may not be repeated in some embodiments.

Figure 1A:
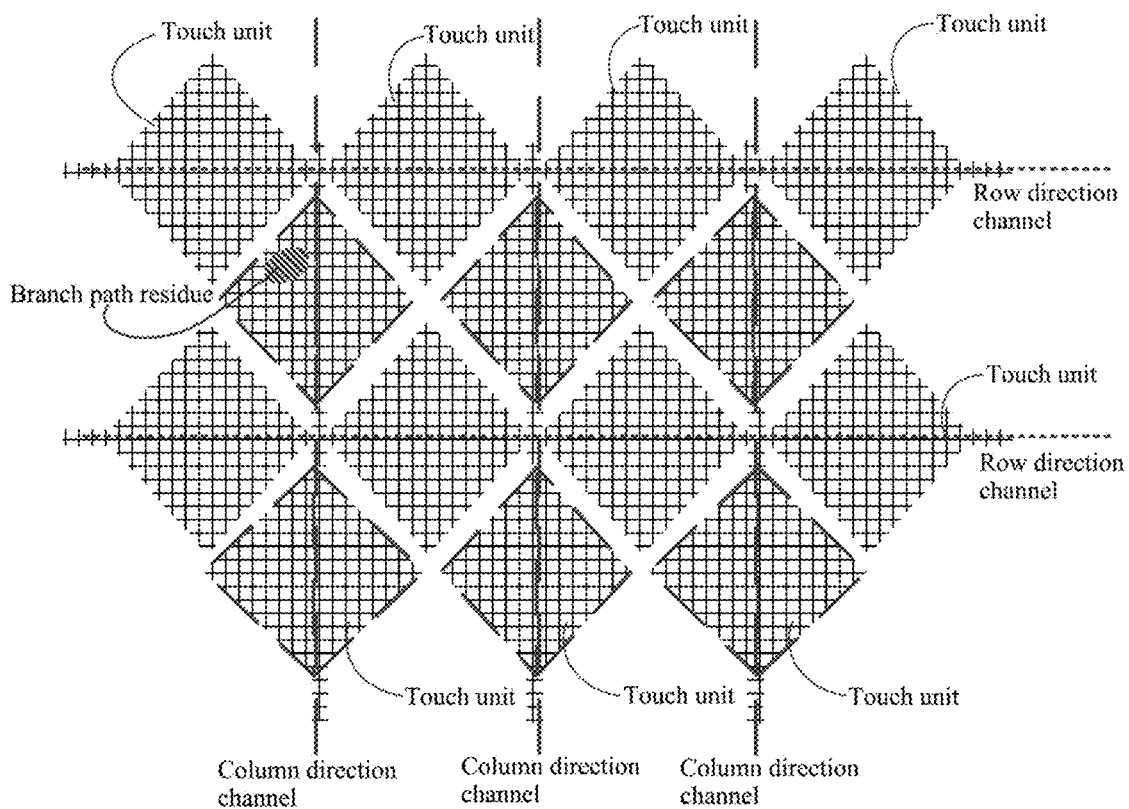
FIG. 1a is a schematic diagram of a structure of a metal mesh.
Figure 1B:
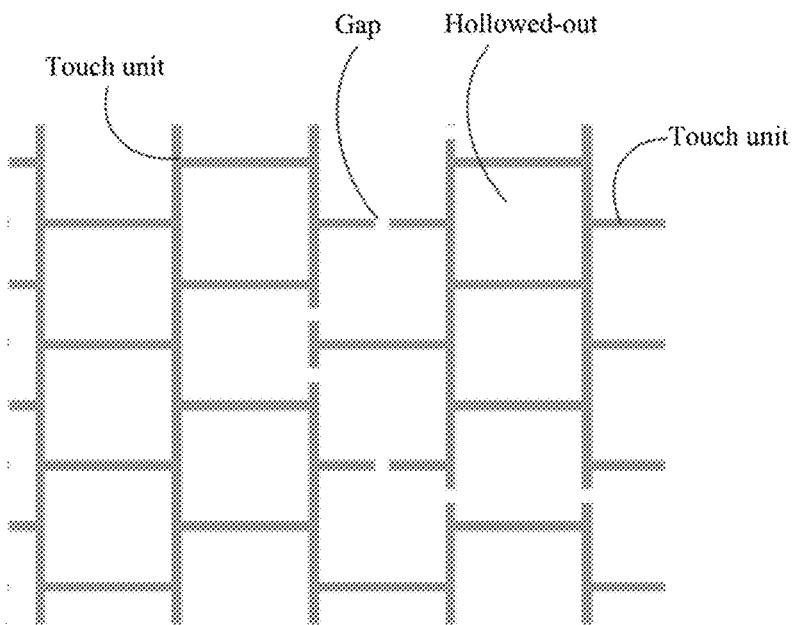

A metal mesh sensor uses metal meshes as an electrical conductive function layer of a sensor, to achieve sensing and driving functions. In a manufacturing process of a touch panel using a metal mesh sensor, electrical detection of metal meshes therein is an important step. FIG. 1a is a schematic diagram of a structure of a metal mesh. The diamond blocks formed by meshes in FIG. 1 illustrate touch units arranged in row directions and column directions of metal meshes 10 and channels formed by the touch units. In FIG. 1a, the touch units on column direction channels are selected with dashed line frames, parts of the touch units along the dashed lines are main paths of the column direction channels, and the remaining parts are branch paths. Wherein, a branch path residue is shown in FIG. 1a. FIG. 1b is a schematic diagram of a microstructure of the metal meshes shown in FIG. 1a. As shown in FIG. 1b, all the touch units in the metal meshes are composed of hollowed-out wirings in the same square shape, and discontinuous fractures in square structures form gaps between unconnected touch units in FIG. 1b. In FIG. 1a, the touch units in a row direction constitute a row direction channel, and the touch units in a column direction constitute a column direction channel. At present, the metal meshes 10 usually include a plurality of row direction channels and a plurality of column direction channels insulated and intersected with the row direction channels; both the row direction channels and the column direction channels include a plurality of touch units connected with each other. The intersections between the row direction channels and the column direction channels are insulated and overlapped, and smallest repeating units on the row direction channels and the column direction channels are the touch units. As shown in FIG. 1b, hollowed-out wirings for sensing electrical signals are arranged in each of the touch units, and hollowed-out portions provide gaps for light emission of pixels below. A metal used in the row direction channels and the column direction channels in the metal mesh 10 may be, for example, titanium-aluminum-titanium, or molybdenum, and there is no limitation on this in the present disclosure.

In use of the metal mesh sensor, if a disconnection defect or a residual defect separately exists in a row direction channel and a column direction channel of the metal meshes, or a short-circuit occurs between adjacent channels, touch effects will be affected. Where the disconnection defect includes a main path disconnection and a branch path disconnection. At present, the non-contact electrical detection technology in the related art usually uses cutting-type scanning row by row, it can detect an abnormity of a main path of a channel; however, when a branch path of a channel is abnormal, since the entire channel can still be conductive, its defect cannot be detected. And, existing detection devices can only position the detection at a channel level, and positioning of the defect is not accurate enough.

In order to improve the detection reliability and accuracy for a touch panel, the present disclosure discloses a device for detecting a touch panel, the detection of each of the plurality of touch units is achieved through capacitive coupling at least one small-sized signal transceiving component with the metal mesh, and thus utilizing a detection signal of an induction capacitor. Various implementations of the present disclosure will be introduced and exemplified below in combination with the accompanying drawings and specific embodiments.

Figure 2:
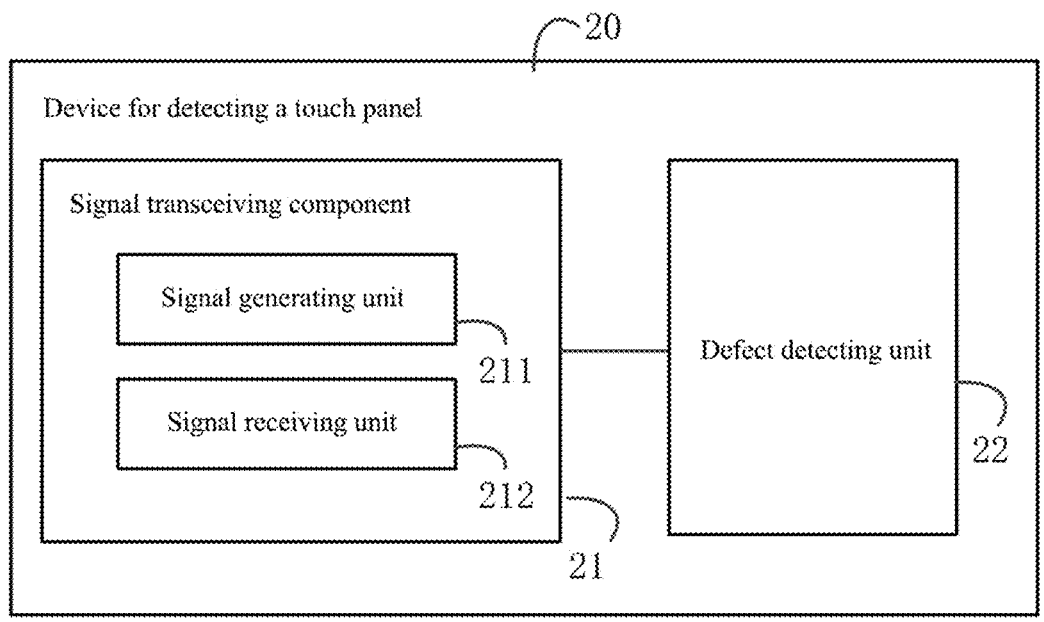
FIG. 2 is a schematic diagram of a structure of a device for detecting a touch panel provided by an embodiment of the present disclosure.

FIG. 2 is a schematic diagram of a structure of a device for detecting a touch panel provided by an embodiment of the present disclosure. A device 20 for detecting a touch panel shown in FIG. 2 is used for detecting the metal meshes 10 (see FIG. 4 or 5) on the touch panel, wherein the device 20 for detecting a touch panel includes: a signal transceiving component 21 and a defect detecting unit 22. The signal transceiving component 21 is configured to be capacitively coupled with the metal meshes 10, so as to obtain a detection signal when passing through a detection area, the signal transceiving component is movably arranged relative to the metal meshes, a comprehensive detection of the metal meshes is achieved through a movement of the signal transceiving component. Where a coupling distance between the signal transceiving component 21 and the metal meshes may be in a range of 10 μm±10 μm, specifically, the capacitive coupling distance can be adjusted according to an actual condition.

Specifically, the signal transceiving component 21 includes a signal generating unit 211 and a signal receiving unit 212. The signal generating unit 211 is configured to send out an original signal, and the original signal generates a detection signal on a metal mesh 10; the signal receiving unit 212 is configured to receive the detection signal at a fixed distance from the signal generating unit 211 on the metal mesh 10.

Figure 3:
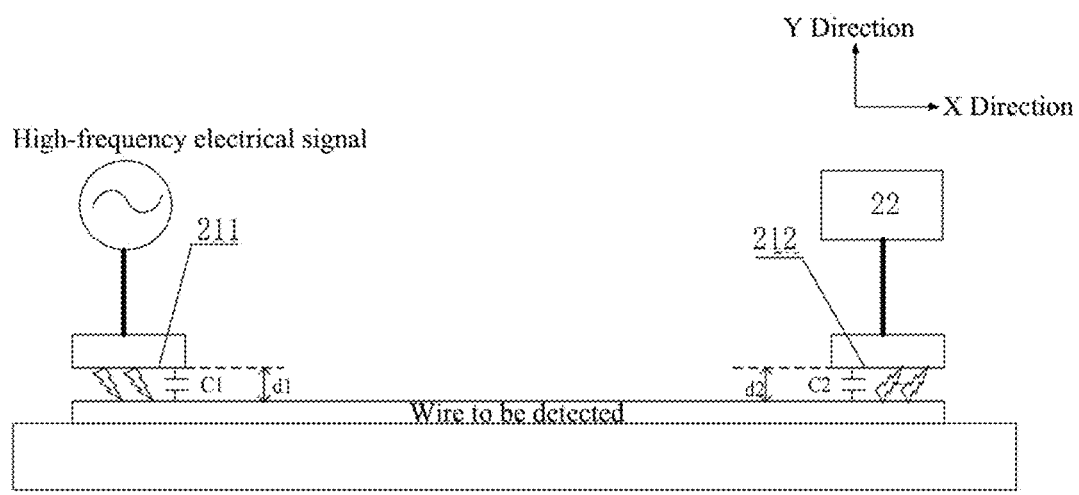
FIG. 3 is a schematic diagram of detection principle of a device for detecting a touch panel provided by an embodiment of the present disclosure.

See FIG. 3, FIG. 3 is a schematic diagram of detection principle of a device for detecting a touch panel provided by an embodiment of the present disclosure. As shown in FIG. 3, when both the signal generating unit 211 and the signal receiving unit 212 are arranged above the metal mesh of the touch panel to be detected, a distance between an emitting surface of the signal generating unit 211 and the metal mesh to be detected is d1, and a distance between a receiving surface of the signal receiving unit 212 and the metal mesh to be detected is d2. Therefore, when a high-frequency signal is applied between the signal generating unit 211 and the signal receiving unit 212, the emitting surface of the signal generating unit 211 and the metal mesh to be detected can approximately form a plate capacitor C1, the receiving surface of the signal receiving unit 212 and the metal mesh to be detected can approximately form a plate capacitor C2. The emitting surface of the signal generating unit 211 and the receiving surface of the signal receiving unit 212 serves as one of plates of a corresponding plate capacitor, and can be made of a metal material.

Based on the working principle of a capacitor loading a high-frequency signal, by loading a high-frequency voltage signal to the emitting surface of the signal generating unit 211, the high-frequency voltage signal can pass through the plate capacitor C1, the metal mesh to be detected and the plate capacitor C2, and finally be received by the receiving surface of the signal receiving unit 212. An object to be detected shown in FIG. 3 is the metal mesh through which the high-frequency voltage signal passes. If the metal mesh to be detected has no defect position, the detection signal received by the signal receiving unit 212 is consistent with the fluctuation law of the waveform of the high-frequency voltage signal loaded by the signal generating unit 211.

Figure 4:
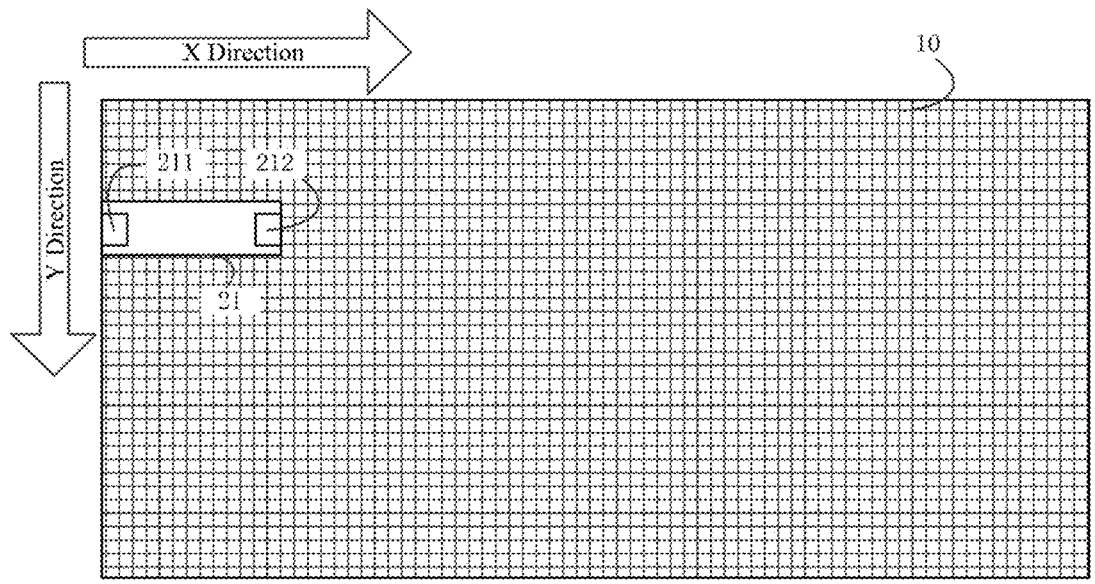
FIG. 4 is a schematic diagram of a signal transceiving component detecting a metal mesh provided by an embodiment of the present disclosure.

FIG. 4 is a schematic diagram of a signal transceiving component detecting a metal mesh provided by an embodiment of the present disclosure. As shown in FIG. 4, the signal generating unit 211 and the signal receiving unit 212 are configured to be arranged on the same side of the metal meshes in preset relative positions, and send and receive signals through capacitive coupling with the metal meshes 10, respectively. It can be seen from FIG. 4 that a layout area of the signal generating unit 211 and the signal receiving unit 212 only covers a partial of metal meshes, and only situations of the metal meshes within the layout area can be determined; in order to achieve a comprehensive detection of the metal meshes, the signal generating unit 211 and the signal receiving unit 212 provided by the present disclosure are movably arranged relative to the metal mesh. In this way, the preset relative positions can be considered that the relative positions are fixed, which requires that the signal generating unit 211 and the signal receiving unit 212 move synchronously during movement scanning detection, so as to reduce the influence of the a relative position change on the detection accuracy.

During the movement scanning detection, for example, the signal transceiving component 21 is movably arranged above the metal mesh to be detected, maintains a predetermined gap with the metal mesh to be detected, and, forms, after the signal transceiving component 21 is loaded with a stable high-frequency signal, a capacitive coupling path with the metal mesh to be detected below. A portion of the metal mesh through which the capacitive coupling path passes is the metal mesh to be detected as shown in FIG. 3. The signal transceiving component 21 is controlled to move along the row direction of the metal mesh to be detected (the X direction shown in FIG. 4), and collects the detection signal received by the signal receiving unit 212 during the movement. When the signal transceiving component 21 moves to or is close to a defect position, a waveform of the detection signal will be abnormal. The waveform of the detection signal can be used to determine whether the touch unit on the metal mesh to be detected has a defect, and determine a position of the defect.

The metal mesh 10 itself is not provided with an electrical signal additionally, but to obtain an electrical signal by coupling with an original signal sent by the signal generating unit 211, the electrical signal then passes through an electrically connected line, and subsequently is received by the signal receiving unit 212. The signal transceiving component 21 and the metal mesh 10 can be simply understood as a capacitor structure. Due to a principle that a size of a capacitance value is directly proportional to the area of a sensing plate, the larger the area of the capacitance plate, the larger the capacitance value, which can be understood as the amplitude of the electrical signal is greater. If there is a disconnection defect (including a main path disconnection defect and a branch path disconnection defect) in the metal mesh 10 in a detection area between the signal generating unit 211 and the signal receiving unit 212, a coupling area will be less than a normal coupling area, and the amplitude of the detection signal received by the signal receiving unit 212 will be smaller than a normal amplitude. And, if there is a residual defect (including a residual defect that causes a short-circuit of adjacent channels and a residual defect that does not affect electrical performance) in the metal mesh 10 in a detection area between the signal generating unit 211 and the signal receiving unit 212, the coupling area will be greater than the normal coupling area, and the amplitude of the detection signal received by the signal receiving unit 212 will be greater than a normal amplitude. In this way, a non-contact detection of the metal mesh can be achieved.

The defect detecting unit 22 connected with the signal transceiving component 21 is used for detecting each of the plurality of touch units in the metal mesh 10 based on a detection signal received by the signal receiving unit 212. In a detection manner shown in FIG. 3, the signal transceiving component 21 may use the touch unit as the smallest detecting unit. The signal transceiving component 21 uses the touch unit as a minimum moving distance unit, and a center line for detecting is, for example, coincident with a center line of a channel where the touch unit to be detected is located, so as to increase a coverage area and detection accuracy of the signal transceiving component 21 to the detected touch unit. The defect detection unit 22 analyzes the detection signal received by the signal receiving unit 212, so as to determine whether the touch unit corresponding to the detection signal is defective and defect types that may exist. A specific analysis method can be seen from subsequently listed examples of the defect detecting unit 22.

The present embodiment provides a device 20 for detecting a touch panel, and the device is used for detecting the metal meshes 10 on the touch panel, wherein the row direction channels and the column direction channels on the metal meshes 10 are composed of touch units which are connected with each other. In the device 20 for detecting a touch panel, the signal transceiving component 21 includes a signal generating unit 211 and a signal receiving unit 212; the signal generating unit 211 and the signal receiving unit 212 are configured to be arranged on the same side of the metal meshes 10 in preset relative positions, and send and receive signals through capacitive coupling with the metal meshes 10, respectively; the defect detecting unit 22 is configured to detect each of the plurality of touch units in the metal meshes 10 based on a detection signal received by the signal receiving unit 212, thereby achieving a detection of a defect of the metal meshes of the touch panel, positioning of the defect in the touch unit, and improving a detection reliability.

In order to improve the detection accuracy and reliability of the signal transceiving component 21 in the embodiment shown in FIG. 4, the following are some optional embodiments of sizes of the signal transceiving component 21.

In some embodiments, a detection width of the signal transceiving component 21 is greater than a size of each of the plurality of touch units in a width direction, and is less than or equal to a size of three touch units in the width direction, wherein the detection width is a size of a detection area of the signal transceiving component 21 in the width direction, and the width direction is a direction perpendicular to a detection direction. Taking a scanning detection in the X direction in FIG. 4 as an example, the detection direction is the X direction, and the width direction is the Y direction. The detection width can be a maximum distance in the Y direction that the signal transceiving component 21 can detect. Herein, the detection area can be specifically obtained by an experiment. By limiting the detection width, it is ensured that the signal transceiver component 21 can span between two channels or three channels. In this way, it is possible to detect whether there is a short-circuit defect between a touch unit and an adjacent channel. In some implementations of the present embodiment, the width of the signal generating unit 211 is a size of one touch unit in the width direction; a width of the signal receiving unit 212 is greater than a size of each of the plurality of touch units in the width direction, and is less than or equal to a size of three touch units in the width direction.

In some embodiments, a detection length of the signal transceiving component 21 is greater than or equal to a size of each of the plurality of touch units in a length direction; wherein the detection length is a size of a detection area of the signal transceiving component 21 in the length direction, and the length direction is a direction consistent with a detection direction. Taking a scanning detection in the X direction in FIG. 4 as an example, the detection direction and the length direction are the X direction. The detection length can be a maximum distance in the X direction that the signal transceiving component 21 can detect. For example, In an embodiment where the signal transceiving component 21 includes one signal generating unit 211 and one signal receiving unit 212, the detection length of the signal transceiving component 21 can be understood as a distance in the X direction coupling with the one signal generating unit 211 and the one signal receiving unit 212 on metal meshes 10, respectively. Herein, the detection area can be specifically obtained by an experiment. The detection length is limited so that the detection signal of the signal transceiving component 21 can be used to detect at least one complete touch unit every time, and each of the plurality of touch units is at least partially detected repeatedly, thereby improving the reliability and accuracy of detection.

In some embodiments, a plurality of the signal transceiving components 21 can be arranged to scan and detect multiple rows/columns at the same time, for example, the device for detecting a touch panel includes a plurality of the signal transceiving components 21 and the plurality of the signal transceiving components 21 are arranged in a width direction; wherein the width direction is a direction perpendicular to a detection direction. In order to improve the accuracy of detection, each signal transceiving component 21 is used to detect the row direction channels or the column direction channels, detection areas of the plurality of the signal transceiving components 21 are distributed at equal intervals, and a distance between centers of two adjacent signal transceiving components 21 is a size of N touch units in the width direction, the N is an integer greater than or equal to 2. For example, when detecting in the X direction, the distance between centers is equal to the size of two touch units in the width direction, and a circuit that detects the X direction needs to be scanned at least 3 times to ensure the detection accuracy and high positioning accuracy. Through synchronous detection of the plurality of the signal transceiving components 21, the detection efficiency is improved. Furthermore, by limiting the distance between centers, an integer multiple of the number of detections can cover exactly all areas, which further improves the reliability of detection.

Figure 5:
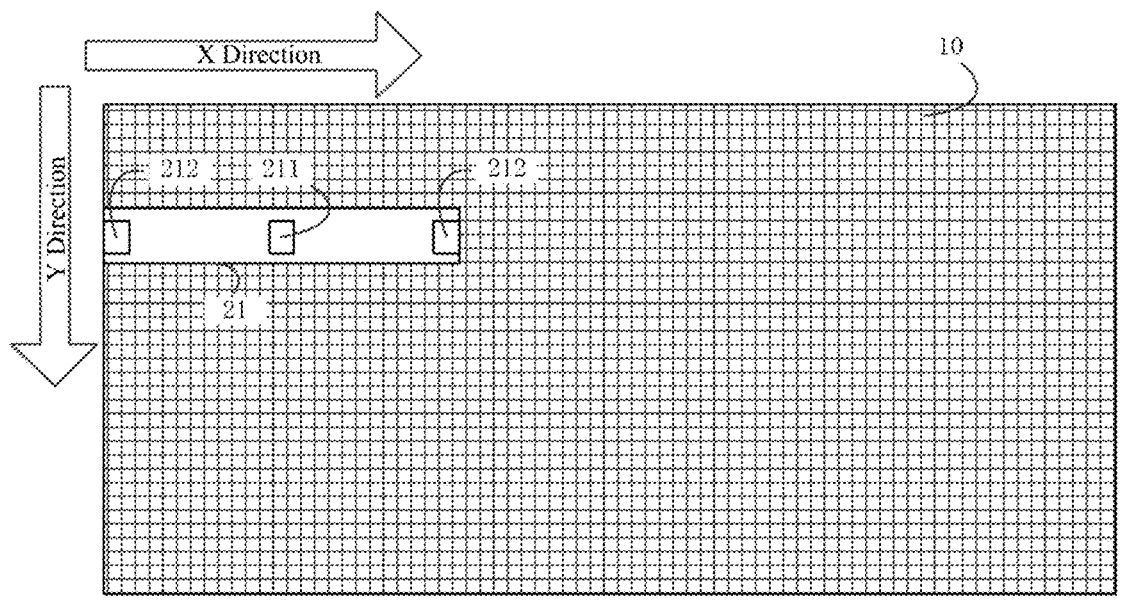
FIG. 5 is a schematic diagram of a structure of a signal transceiving component with two signal receiving units provided by an embodiment of the present disclosure.

In the above embodiment, the signal transceiving component 21 can include one signal generating unit 211 and one signal receiving unit 212, but the present embodiment is not limited thereto. Furthermore, the signal transceiving component 21 can be arranged as including one signal generating unit 211 and two signal receiving units 212. FIG. 5 is a schematic diagram of a structure of a signal transceiving component with two signal receiving units provided by an embodiment of the present disclosure. As shown in FIG. 5, the two signal receiving units 212 are arranged along a detection direction, the signal generating unit 211 is arranged between the two signal receiving units 212, and distances form the signal generating unit 211 to the two signal receiving units 212 are the same. By arranging one signal receiving unit 212 at the front and the back of the detection direction, respectively, and detecting two detection areas in front of and behind the signal generating unit 211 at the same time, the repeated detection of overlapped areas is implemented during a scanning detection process, thereby improving the comprehensiveness and reliability of detection.

Continuing to refer to the embodiment shown in FIG. 5, optionally, a position where a single signal generating unit 211 is capacitively coupled with the metal mesh 10 and a position where the two signal receiving units 212 are capacitively coupled with the metal meshes 10 are aligned with centers of row direction channels or column direction channels of the metal meshes 10 in the detection direction. By making the signal generating unit 211 and the two signal receiving units 212 in a straight line, the accuracy of detection and positioning is further improved.

Figure 6:
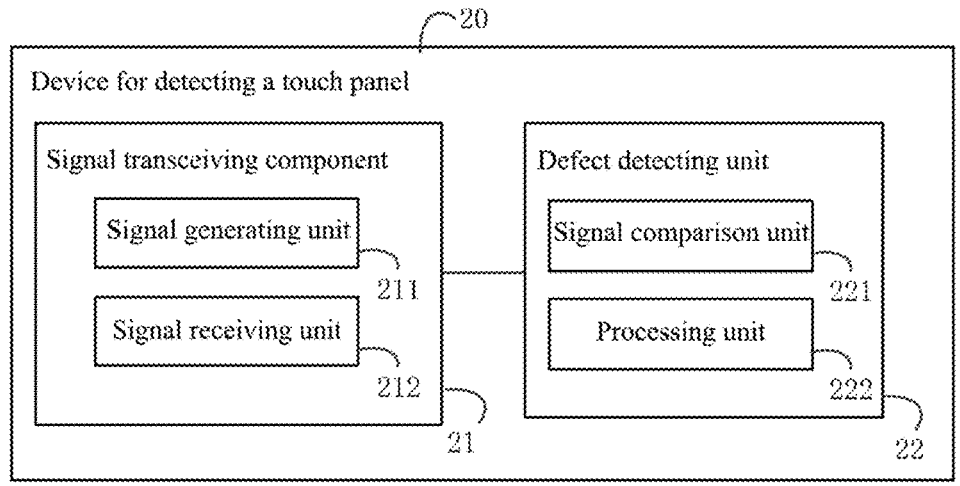
FIG. 6 is a schematic diagram of a structure of another device for detecting a touch panel provided by an embodiment of the present disclosure.

FIG. 6 is a schematic diagram of a structure of another device for detecting a touch panel provided by an embodiment of the present disclosure. On the basis of the above various embodiments, in some embodiments, the signal transceiving component 21 can include a signal generating unit 211 and a signal receiving unit 212. The defect detecting unit 22 connected with the signal transceiving component 21 can specifically include a signal comparison unit 221 and a processing unit 222, as shown in FIG. 6.

Figure 7:
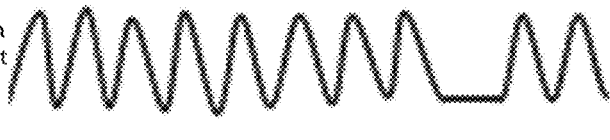
FIG. 7 shows examples of comparison of waveforms of detection signals corresponding to several types of defects provided by an embodiment of the present disclosure.
Figure 7:
Figure 7:
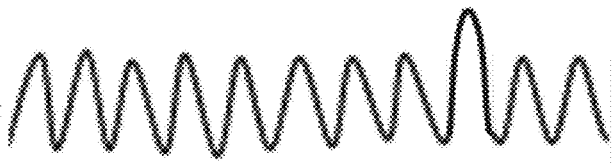
Figure 7:
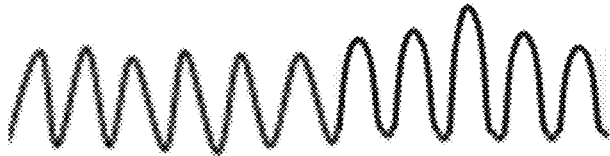

In some embodiments shown in FIG. 6, the signal comparison unit 221 is configured to obtain the detection signal from the signal receiving unit 212, and determine an abnormal wave band based on a change of a waveform of the detection signal. FIG. 7 shows examples of comparison of waveforms of detection signals corresponding to several types of defects provided by an embodiment of the present disclosure. In the waveforms shown in FIG. 7, a normal waveform should be a sine wave, and wave bands with increased and decreased amplitude are abnormal wave bands with defects in corresponding positions. The signal waveform is a waveform of a time domain, and a detection position corresponding to each wave band is determined; a touch unit with a defect can be determined by calculating a moving position of the signal transceiving component 21.

Continuing to refer to the processing unit 222 shown in FIG. 6, it is used for determining the touch unit with a defect in the metal mesh 10 based on a detection position of the signal transceiving component 21 at a time corresponding to the abnormal wave band, and determining whether an amplitude of the abnormal wave band is large than an average amplitude of multiple adjacent wave bands.

(1) See FIG. 7, if it is determined that the amplitude of the abnormal wave band is greater than the average amplitude of multiple adjacent wave bands, the processing unit 222 will determine whether an amplitude variance of the abnormal wave band and the multiple adjacent wave bands is greater than a preset threshold:

if yes, it is determined that a defect type is that the touch unit corresponding to the detection position has a residual defect; if not, it is determined that the defect type is that the touch unit corresponding to the detection position has a short-circuit defect with an adjacent channel.

(2) See FIG. 7, if it is determined that the amplitude of the abnormal wave band is less than the average amplitude of multiple adjacent wave bands, the processing unit 222 will determine whether the amplitude of the abnormal wave band is 0:

if it is determined that the amplitude of the abnormal wave band is 0, it is determined that the defect type is that there is a main path disconnection defect in the touch unit corresponding to the detection position; if it is determined that the amplitude of the abnormal wave band is not 0, it is determined that the defect type is that there is a branch path disconnection defect in the touch unit corresponding to the detection position.

As a result, the device 20 for detecting a touch panel in the present embodiment can distinguish the residual defect from the short-circuit defect of adjacent channels in the touch unit, and can also distinguish the main path disconnection defect from the branch path disconnection defect, having relatively high defect detection capacity, and improving the detection reliability for the touch panel.

In an embodiment where the signal transceiving component 21 includes one signal generating unit 211 and two signal receiving units 212, the implementation principle thereof can refer to the embodiment where the signal transceiving component 21 includes one signal generating unit 211 and one signal receiving unit 212; and there may be two defect detecting units 22, which respectively analyze the detection signals of the two signal receiving units 212, the effect of its implementation principle is similar to the above, and will not be repeated herein.

In the above embodiment, the signal transceiving component 21 may be composed of one signal generating unit 211 and one signal receiving unit 212, or may be composed of one signal generating unit 211 and a plurality of the signal receiving units 212.

Figure 8:
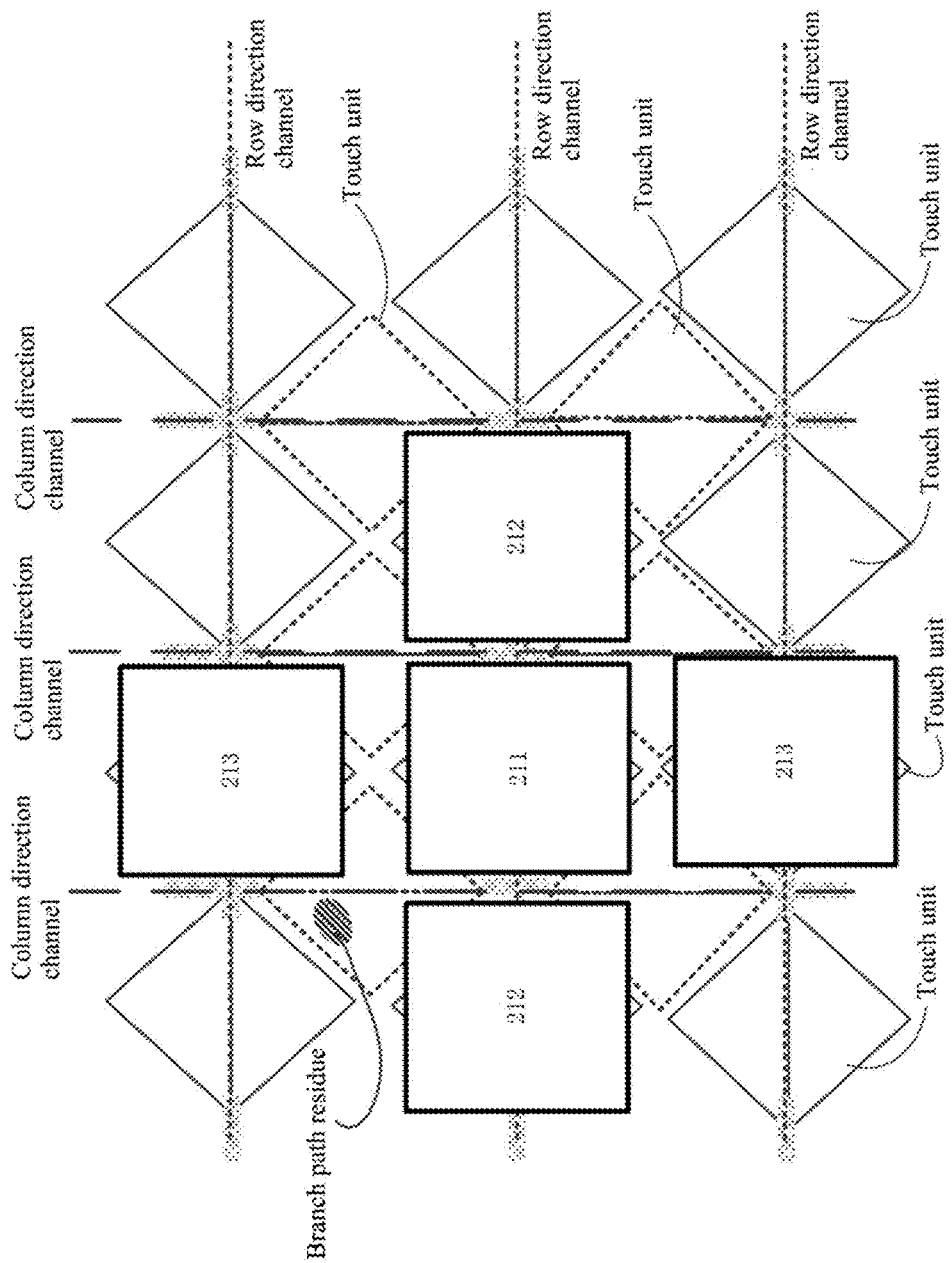
FIG. 8 is a schematic diagram of a structure of a signal transceiving component with two auxiliary receiving units provided by an embodiment of the present disclosure.
Figure 9:
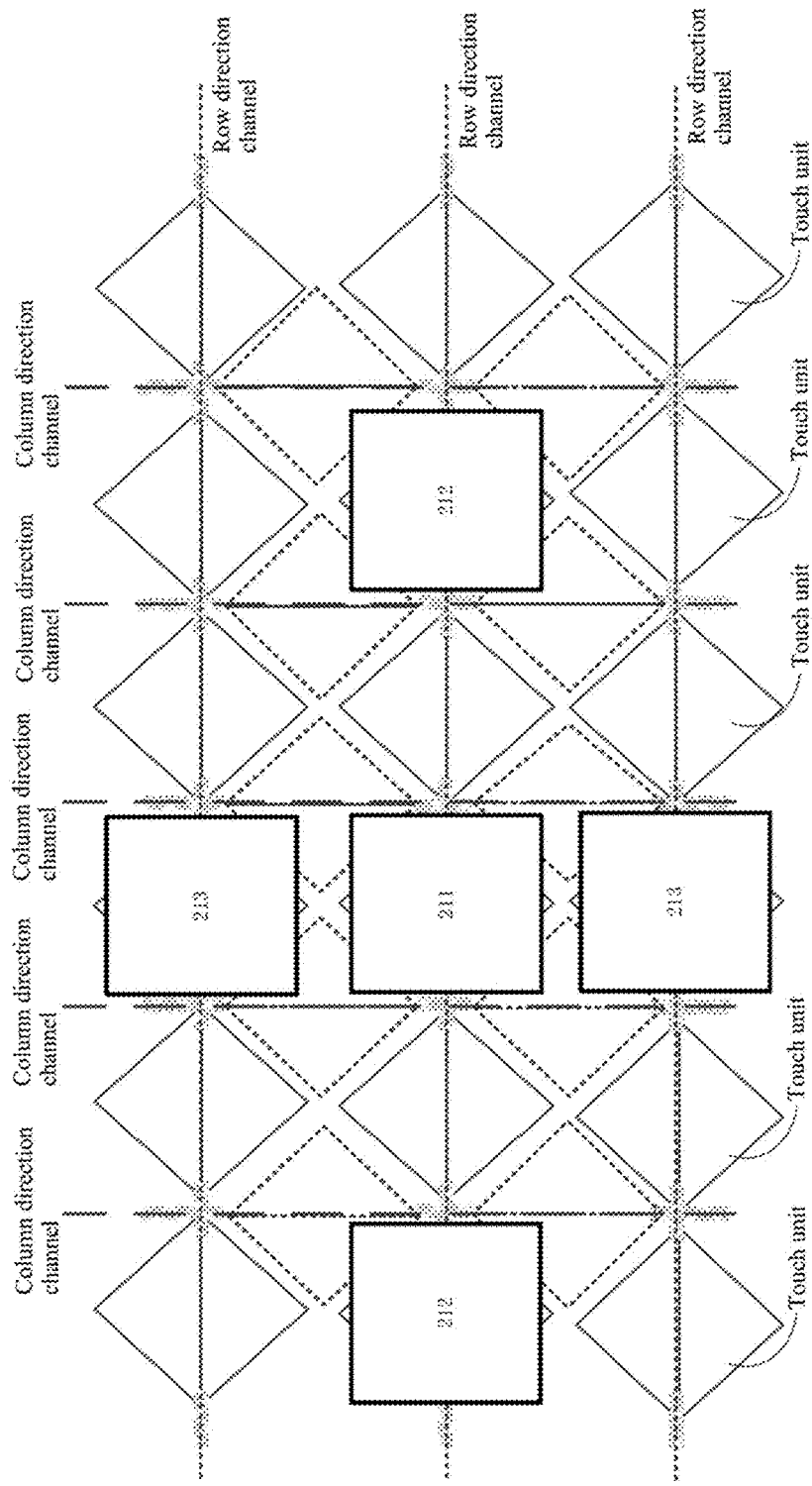
FIG. 9 is a schematic diagram of a structure of another signal transceiving component with two auxiliary receiving units provided by an embodiment of the present disclosure.

In an embodiment with a plurality of the signal receiving units 212, in addition to the signal generating unit 211 and the signal receiving unit 212, the signal transceiving component may further include two auxiliary receiving units 213. FIG. 8 is a schematic diagram of a structure of a signal transceiving component with two auxiliary receiving units provided by an embodiment of the present disclosure. FIG. 9 is a schematic diagram of a structure of another signal transceiving component with two auxiliary receiving units provided by an embodiment of the present disclosure. In FIG. 8 and FIG. 9, solid line diamonds indicate the touch units connected in the row direction channels, and dotted line diamonds indicate the touch units connected in the column direction channels. The structure of the auxiliary receiving units 213 here is the same as that of the signal receiving unit 212, and both are for receiving the detection signal on the metal meshes 10, but the main function of the auxiliary receiving units 213 is to provide an auxiliary reference for determining the defect type. As shown in FIG. 8, the two auxiliary receiving units 213 are symmetrically arranged on both sides of the signal generating unit 211 in a direction perpendicular to the detection direction, and a detection distance between the two auxiliary receiving units 213 is less than or equal to a size of two touch units in a detection width. The detection distance of the auxiliary receiving units 213 is a distance that can be detected in the direction perpendicular to the detection direction. Where the detection distance is a distance between the two auxiliary receiving units 213 and the position capacitively coupled with the metal mesh. In a specific implementation, the detection width of the signal receiving unit 212 in the present embodiment is the width of one touch unit; the detection width of one auxiliary receiving unit 213 is less than the width of one touch unit. The position layout is as follows: the signal receiving unit 212 and the signal generating unit 211 are respectively in the middle of a channel to be detected, and the two auxiliary receiving units 213 are on both sides of the signal receiving unit 212 and on center lines of channels on both sides.

The signal transceiving components shown in FIG. 8 and FIG. 9 are all layouts when detecting in the row direction, and the signal transceiving component includes two signal receiving units 212, two auxiliary receiving units 213 and one signal generating unit 211. The metal mesh is capacitively coupled with two opposite units, and a distance between the edges of two coupling areas away from the signal generating unit is the detection distance of the two opposite units. The two opposite units can be two signal receiving units 212 or two auxiliary receiving units 213. Where the detection distance between the two signal receiving units 212 forms a detection length of the signal transceiving component. FIG. 8 shows that the detection length of the signal transceiving component is 3 touch units. And, FIG. 9 shows that the detection length of the signal transceiving component is 5 touch units. The detection distance between the two auxiliary receiving units 213 forms the detection width of the signal transceiving component. Both FIG. 8 and FIG. 9 show that the detection width of the signal transceiving component is 3 touch units. The abovementioned length direction is the detection direction, and the width direction is a direction perpendicular to the detection direction. FIG. 8 and FIG. 9 are only schematic diagrams of the detection length and detection width of the signal transceiving component, and the present disclosure is not limited thereto.

If the touch unit is short-circuited with its adjacent previous row/column channel, the amplitude of the waveform set on the auxiliary receiving unit 213 arranged close to the previous row/column channel will increase; similarly, if the touch unit is short-circuited with its adjacent next row/column channel, the amplitude of the waveform set on the auxiliary receiving unit 213 arranged close to the next row/column channel will increase. By arranging two auxiliary receiving units 213 in a vertical direction of the detection direction, the accuracy and reliability of detection of the short-circuit defect of adjacent channels can be improved.

For the embodiments with the auxiliary receiving units 213 shown in FIG. 8 and FIG. 9, the used defect detecting unit (not shown), whose structure is similar to the structure of the defect detecting unit 22 shown in FIG. 6, can also include a signal comparison unit 221 and a processing unit 222, but the functions of the units are different.

In an embodiment with the auxiliary receiving unit 213, the signal comparison unit 221 is configured to obtain the detection signal from the signal receiving unit 212, obtain a first auxiliary signal and a second auxiliary signal from the two auxiliary receiving units 213, and determine an abnormal wave band based on a change of a waveform of the detection signal; and, respectively determine a first auxiliary wave band and a second auxiliary wave band in waveforms of the first auxiliary signal and the second auxiliary signal based on a detection time corresponding to the abnormal wave band. When the amplitude of the waveform increases, the use of the first auxiliary signal and the second auxiliary signal can assist in improving the accuracy of determining the defect type.

The processing unit 222 shown in FIG. 6 is configured to determine the touch unit which is defective in the metal mesh based on a detection position of the signal transceiving component 21 at a time corresponding to the abnormal wave band, and determine whether an amplitude of the abnormal wave band is greater than an average amplitude of multiple adjacent wave bands.

(1) Continuing to refer to FIG. 7, if it is determined that the amplitude of the abnormal wave band is greater than the average amplitude of multiple adjacent wave bands, it is determined whether the amplitude of the first auxiliary wave band or the second auxiliary wave band is greater than 0:

if yes, it is determined that the defect type is that the touch unit corresponding to the detection position has a short-circuit defect with an adjacent channel; if not, it is determined that the defect type is that the touch unit corresponding to the detection position has a residual defect.

In some cases, the residual defect in a single channel, for example, residues on the main or branch path of the touch unit, may not affect the electrical performance of the touch panel. However, a residual part leads to a reduction of a local light-passing area, the light emitted from pixels below is blocked, causing a local dark spot and affecting the display effect. Therefore, it is very important to detect the residual defect on the main or branch path of the touch unit. By the auxiliary receiving unit 213, the accuracy of detection of the short-circuit defect between the touch unit and the adjacent channel and the residual defect of the touch unit is improved, and the detection of the short-circuit defect of adjacent channels has higher accuracy and reliability.

(2) Continuing to refer to FIG. 7, if it is determined that the amplitude of the abnormal wave band is less than the average amplitude of multiple adjacent wave bands, it is determined whether the amplitude of the abnormal wave band is 0:

if it is determined that the amplitude of the abnormal wave band is 0, it is determined that the defect type is that there is a main path disconnection defect in the touch unit corresponding to the detection position; if it is determined that the amplitude of the abnormal wave band is not 0, it is determined that the defect type is that there is a branch path disconnection defect in the touch unit corresponding to the detection position.

On the basis of the above various embodiments, the present disclosure further provides a system for detecting a touch panel, including a movement device and the device 20 for detecting a touch panel described in any of the above embodiments.

Where the movement device is configured to control the signal transceiving components 21 to move along center lines of the row direction channels and the column direction channels of the metal mesh 10, and send positioning information indicating detection position of the signal transceiving component 21 to the defect detecting unit 22.

Herein, for example, the movement device can be a movement device with an X movement axis and a Y movement axis, the device 20 for detecting a touch panel is driven by the X movement axis to detect the metal meshes 10 on the touch panel in the X direction, and then the device 20 for detecting a touch panel is driven by the Y movement axis to detect the metal meshes 10 on the touch panel in the Y direction. For example, the movement device can include a carrier platform and a movement arm matched with the carrier platform, and after the movement device controls the signal transceiving component 21 to perform a detection in the X direction, the carrier platform carrying the metal meshes can be rotated by 90 degrees, and then a detection in the Y direction can be performed. It is also possible that the movement arm controls the signal transceiving component 21 to change from scanning in the X direction to scanning in the Y direction. The implementation manner of the movement device is not limited herein.

Finally, it should be noted that the above embodiments are only used to illustrate the technical solutions of the present disclosure, without limitation to the technical solutions. Although the present disclosure has been described in detail with reference to the foregoing embodiments, those skilled in the art should understand: modifications to the technical solutions described in the foregoing embodiments, or equivalent substitutions of some or all of the technical features therein can still be made. However, these modifications or substitutions shall not make the essential of corresponding technical solutions depart from the scope of the technical solutions of the embodiments of the present disclosure.

What is claimed is:

1. A device for detecting a touch panel, and further for detecting a metal mesh on the touch panel, the device for detecting the touch panel comprising: a signal transceiving component that is movably arranged relative to the metal mesh, and comprises a signal generating unit and a signal receiving unit, wherein the signal generating unit and the signal receiving unit are configured to be arranged on the same side of the metal meshes in preset relative positions, and send and receive a signal through capacitive coupling with the metal mesh, respectively; and a defect detecting unit that is configured to detect whether each of a plurality of touch units in the metal mesh has a defect based on a detection signal received by the signal receiving unit and determine a position of the defect wherein the defect detecting unit comprises a signal comparison unit and a processing unit; the signal comparison unit is configured to obtain the detection signal from the signal receiving unit, and determine an abnormal wave band based on a change of a waveform of the detection signal; the processing unit is configured to determine a touch unit which has a defect in the metal meshes based on a detection position of the signal transceiving component at a time corresponding to the abnormal wave band, and determine whether an amplitude of the abnormal wave band is greater than an average amplitude of multiple adjacent wave bands; if it is determined that the amplitude of the abnormal wave band is greater than the average amplitude of the multiple adjacent wave bands, then it is determined whether an amplitude variance of the abnormal wave band and the multiple adjacent wave bands is greater than a preset threshold; if yes, it is determined that a defect type is that a touch unit corresponding to the detection position has a residual defect; if not, it is determined that the defect type is that the touch unit corresponding to the detection position has a short-circuit defect with an adjacent channel; and if it is determined that the amplitude of the abnormal wave band is less than the average amplitude of the multiple adjacent wave bands, then it is determined whether the amplitude of the abnormal wave band is 0; if it is determined that the amplitude of the abnormal wave band is 0, then it is determined that the defect type is that there is a main path disconnection defect in the touch unit corresponding to the detection position; if it is determined that the amplitude of the abnormal wave band is not 0, then it is determined that the defect type is that there is a branch path disconnection defect in the touch unit corresponding to the detection position.

2. The device according to claim 1, wherein the metal mesh comprises a plurality of row direction channels and a plurality of column direction channels insulated and intersected with the row direction channels; the row direction channels and the column direction channels each comprise the plurality of touch units connected with each other.

3. The device according to claim 1, wherein a detection width of the signal transceiving component is greater than a size of each of the plurality of touch units in a width direction, and is less than or equal to a size of three touch units in the width direction; the detection width is a size of a detection area of the signal transceiving component in the width direction, and the width direction is a direction perpendicular to a detection direction.

4. The device according to claim 1, wherein a detection length of the signal transceiving component is greater than or equal to a size of each of the plurality of touch units in a length direction; the detection length is a size of a detection area of the signal transceiving component in the length direction, and the length direction is a direction consistent with a detection direction.

5. The device according to claim 1, wherein the device for detecting the touch panel comprises a plurality of the signal transceiving components and the plurality of the signal transceiving components are arranged in a width direction.

6. The device according to claim 5, wherein detection areas of the plurality of the signal transceiving components are distributed at equal intervals, and a distance between centers of two adjacent signal transceiving components is a size of N touch units in the width direction, wherein the width direction is a direction perpendicular to a detection direction, and the N is an integer greater than or equal to 2.

7. The device according to claim 1, wherein the signal transceiving component comprises a signal generating unit and two signal receiving units.

8. The device according to claim 7, wherein the two signal receiving units are arranged along a detection direction, the signal generating unit is arranged between the two signal receiving units, and distances form the signal generating unit to the two signal receiving units are the same.

9. The device according to claim 7, wherein a position where the signal generating unit is capacitively coupled with the metal mesh and a position where the two signal receiving units are capacitively coupled with the metal mesh are aligned with centers of a row direction channel or a column direction channel of the metal meshes in a detection direction.

10. The device according to claim 1, wherein the signal transceiving component further comprises two auxiliary receiving units; and
the two auxiliary receiving units are symmetrically arranged on both sides of the signal generating unit in a direction perpendicular to a detection direction, and a detection distance between the two auxiliary receiving units is less than or equal to a size of two touch units in a detection width.

11. The device according to claim 10, wherein the defect detecting unit comprises a signal comparison unit and a processing unit;
the signal comparison unit is configured to obtain the detection signal from the signal receiving unit, obtain a first auxiliary signal and a second auxiliary signal from the two auxiliary receiving units, and determine an abnormal wave band based on a change of a waveform of the detection signal; and, respectively determine a first auxiliary wave band and a second auxiliary wave band in waveforms of the first auxiliary signal and the second auxiliary signal based on a detection time corresponding to the abnormal wave band;
the processing unit is configured to determine a touch unit which has a defect in the metal meshes based on a detection position of the signal transceiving component at a time corresponding to the abnormal wave band, and determine whether an amplitude of the abnormal wave band is greater than an average amplitude of multiple adjacent wave bands;
if it is determined that the amplitude of the abnormal wave band is greater than the average amplitude of the multiple adjacent wave bands, then it is determined whether an amplitude of the first auxiliary wave band or an amplitude of the second auxiliary wave band is greater than 0; if yes, it is determined that a defect type is that a touch unit corresponding to the detection position has a short-circuit defect with an adjacent channel; if not, it is determined that the defect type is that the touch unit corresponding to the detection position has a residual defect; and
if it is determined that the amplitude of the abnormal wave band is less than the average amplitude of the multiple adjacent wave bands, then it is determined whether the amplitude of the abnormal wave band is 0; if it is determined that the amplitude of the abnormal wave band is 0, then it is determined that the defect type is that there is a main path disconnection defect in the touch unit corresponding to the detection position; if it is determined that the amplitude of the abnormal wave band is not 0, then it is determined that the defect type is that there is a branch path disconnection defect in the touch unit corresponding to the detection position.

12. A system for detecting a touch panel, comprising a movement device and a device for detecting the touch panel comprising a signal transceiving component that is movably arranged relative to the metal mesh, and comprises a signal generating unit and a signal receiving unit, wherein the signal generating unit and the signal receiving unit are configured to be arranged on the same side of the metal meshes in preset relative positions, and send and receive a signal through capacitive coupling with the metal mesh, respectively; and
a defect detecting unit that is configured to detect whether each of a plurality of touch units in the metal mesh has a defect based on a detection signal received by the signal receiving unit and determine a position of the defect,
wherein the movement device is configured to control the signal transceiving components to move along center lines of a row direction channel and a column direction channel of the metal mesh, and send positioning information indicating a detection position of the signal transceiving component to the defect detecting unit.

13. The system according to claim 12, wherein the metal mesh comprises a plurality of row direction channels and a plurality of column direction channels insulated and intersected with the row direction channels; the row direction channels and the column direction channels each comprise the plurality of touch units connected with each other.

14. The system according to claim 12, wherein a detection width of the signal transceiving component is greater than a size of each of the plurality of touch units in a width direction, and is less than or equal to a size of three touch units in the width direction; the detection width is a size of a detection area of the signal transceiving component in the width direction, and the width direction is a direction perpendicular to a detection direction.

15. The system according to claim 12, wherein a detection length of the signal transceiving component is greater than or equal to a size of each of the plurality of touch units in a length direction; the detection length is a size of a detection area of the signal transceiving component in the length direction, and the length direction is a direction consistent with a detection direction.

16. The system according to claim 12, wherein the device for detecting the touch panel comprises a plurality of the signal transceiving components and the plurality of the signal transceiving components are arranged in a width direction.

17. The system according to claim 16, wherein detection areas of the plurality of the signal transceiving components are distributed at equal intervals, and a distance between centers of two adjacent signal transceiving components is a size of N touch units in the width direction, wherein the width direction is a direction perpendicular to a detection direction, and the N is an integer greater than or equal to 2.

18. The system according to claim 12, wherein the signal transceiving component comprises a signal generating unit and two signal receiving units.

19. The system according to claim 18, wherein the two signal receiving units are arranged along a detection direction, the signal generating unit is arranged between the two signal receiving units, and distances form the signal generating unit to the two signal receiving units are the same.

* * * * *